US007782927B2

(12) United States Patent  
Börker et al.

(10) Patent No.: US 7,782,927 B2
(45) Date of Patent: Aug. 24, 2010

(54) GENERATING A TRANSMISSION CLOCK SIGNAL AND A RECEPTION CLOCK SIGNAL FOR A TRANSCEIVER USING AN OSCILLATOR

(75) Inventors: Philipp Börker, Berlin (DE); Bruno Celli-Urbani, Munich (DE); Dirk Friebe, Munich (DE); David Müller, Munich (DE); Edoardo Prete, Munich (DE); Volkmar Rebmann, Munich (DE); Anthony Sanders, Haar (DE); Dirk Scheideler, Munich (DE)

(73) Assignee: Lantiq Deutschland GmbH, Neubiberg (DE)

( * ) Notice: Subject to any disclaimer, the term of this patent is extended or adjusted under 35 U.S.C. 154(b) by 1518 days.

(21) Appl. No.: 10/991,671

(22) Filed: Nov. 18, 2004

(65) Prior Publication Data

US 2005/0129099 A1  Jun. 16, 2005

(30) Foreign Application Priority Data

Nov. 21, 2003  (DE) ................................. 103 54 558

(51) Int. Cl.
*H04B 1/38* (2006.01)
*H04L 5/16* (2006.01)
*H03D 3/24* (2006.01)
*H04L 7/00* (2006.01)
*H04L 25/00* (2006.01)
*H04L 25/40* (2006.01)

(52) U.S. Cl. ........................ 375/220; 375/219; 375/354; 375/371; 375/373; 375/376; 370/276; 370/277; 455/73; 455/75; 455/76; 455/86; 455/87; 331/44

(58) Field of Classification Search .................. None
See application file for complete search history.

(56) References Cited

U.S. PATENT DOCUMENTS

| 4,253,065 | A | * | 2/1981 | Wyman et al. ............... 327/292 |
| 4,344,179 | A | * | 8/1982 | Ryan ........................... 375/361 |
| 4,580,107 | A | * | 4/1986 | Caldwell et al. .............. 331/10 |
| 5,734,970 | A | * | 3/1998 | Saito ........................... 455/76 |
| 5,864,592 | A | * | 1/1999 | Itri .............................. 375/375 |
| 6,045,652 | A | * | 4/2000 | Tuttle et al. .................. 156/292 |
| 6,205,167 | B1 | * | 3/2001 | Kamgar et al. .............. 375/134 |
| 6,314,145 | B1 | * | 11/2001 | van Driest .................. 375/326 |
| 6,314,150 | B1 | * | 11/2001 | Vowe ........................... 375/374 |
| 6,545,545 | B1 | * | 4/2003 | Fernandez-Texon ........ 331/1 R |
| 6,631,061 | B2 | * | 10/2003 | Okawa ......................... 361/56 |
| 6,907,066 | B1 | * | 6/2005 | Nayler ........................ 375/239 |

(Continued)

FOREIGN PATENT DOCUMENTS

DE  298 23 966  3/2000

(Continued)

*Primary Examiner*—Shuwang Liu
*Assistant Examiner*—Gina McKie
(74) *Attorney, Agent, or Firm*—Dicke, Billig & Czaja, PLLC

(57) ABSTRACT

An arrangement for generating a transmission clock signal and a reception clock signal is proposed in which only a single voltage-controlled oscillator is used, the reception clock signal being generated by phase-adjusting means whereas the transmission clock signal is generated directly by the voltage-controlled oscillator. Cross-talk between a plurality of voltage-controlled oscillators can be prevented in this way. Also, various measures are proposed for optimizing a circuit of this kind.

2 Claims, 6 Drawing Sheets

U.S. PATENT DOCUMENTS

| | | | |
|---|---|---|---|
| 7,295,059 B2 * | 11/2007 | Leete | 327/563 |
| 2003/0104798 A1 | 6/2003 | Boos | |
| 2003/0224747 A1 * | 12/2003 | Anand | 455/208 |
| 2004/0062332 A1 * | 4/2004 | Dabral et al. | 375/373 |
| 2004/0157577 A1 * | 8/2004 | Craninckx | 455/260 |
| 2004/0203557 A1 * | 10/2004 | Zhang | 455/403 |
| 2006/0211393 A1 * | 9/2006 | Chien | 455/265 |
| 2009/0115537 A1 * | 5/2009 | Ramaswamy et al. | 331/44 |

FOREIGN PATENT DOCUMENTS

| | | |
|---|---|---|
| DE | 101 50 536 | 4/2003 |
| DE | 103 38 092 | 4/2005 |
| EP | 0729 238 B1 | 10/2003 |

* cited by examiner

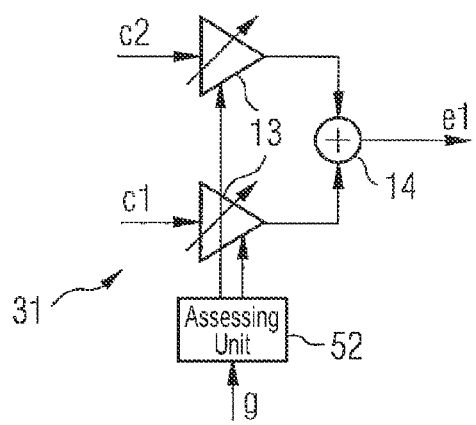
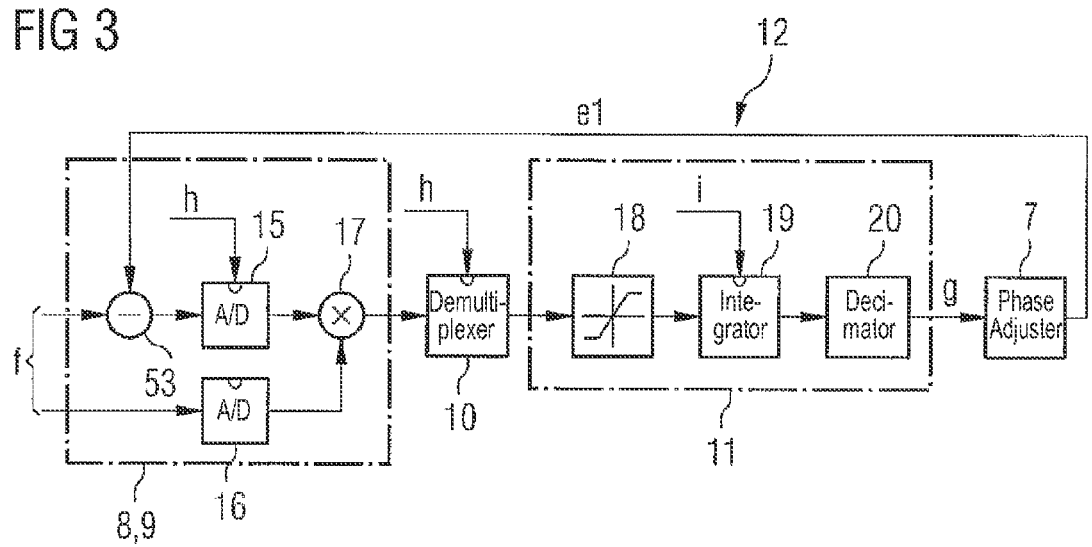

GENERATING A TRANSMISSION CLOCK SIGNAL AND A RECEPTION CLOCK SIGNAL FOR A TRANSCEIVER USING AN OSCILLATOR

CROSS-REFERENCE TO RELATED APPLICATIONS

This Utility Patent Application claims priority to German Patent Application No. DE 103 54 558.1, filed on Nov. 21, 2003, which is incorporated herein by reference.

FIELD OF THE INVENTION

The present invention relates to an arrangement for generating a transmission clock signal and a reception clock signal for a transceiver, and to a transceiver so equipped. The present invention further relates to methods preferably for use in the arrangement and methods of designing and verifying circuits which can be used for such an arrangement.

BACKGROUND

Serial transmissions in which a clock signal is not transmitted are typically employed for data transmissions via high-speed interfaces, where the use of a synchronized source clock signal becomes unreliable and cost-intensive because an uncontrolled shift takes place between the data signals and between the data and clock signals. With interfaces of this kind, the clock signal is removed and each transmission channel is considered to be an independent data stream which requires an independent clock signal recovery at the receiver end.

A diagram of a serial transmission link of this kind is shown in FIG. 9. At the transmission end of such a transmission link, use is made of a multiplexer 43 to multiplex a synchronized data signal n to give a required transmission clock rate by means of a reference clock signal o of relatively low frequency, and to transmit the data signal n over the interface, i.e., transmission channel, 44. At the receiver end, the received signal is sampled by means of a sampling device 45 to allow a data signal p to be obtained. A clock signal q is also recovered. In a demultiplexing means 46, the sampled data signal p is demultiplexed with the help of the clock signal q in order to again obtain a synchronized data signal r having a lower clock rate and a clock signal s of correspondingly reduced frequency.

The process performed at the receiver end is also referred to as clock and data recovery (CDR). In the case of such transmissions it is desirable for the transmission link, and hence the components used for it, to operate over a wide frequency range and to exhibit low phase noise.

The bandwidth for clock signal recovery must be such that a drift or change in the phase of the received signal can be followed and the inherent noise must be so low that the sampling error remains low even when there is high jitter.

Conventional solutions for high-speed transceivers use two independent voltage-controlled oscillators (VCOs) for the transmission and reception sections to generate a transmission clock signal and a reception clock signal.

A typical layout for generating a transmission clock signal is shown in FIG. 10. In it, a reference signal a, which may for example be generated by a quartz oscillator, and a feedback signal b are fed to a phase detector or phase-frequency detector 1. From these, the phase-frequency detector 1 generates a phase-difference signal, which is filtered by a loop filter 2, thus producing a control signal for controlling a voltage-controlled oscillator 3. As a function of the control signal fed to it, the voltage-controlled oscillator 3 emits a transmission clock signal c which, via a frequency divider 5, is fed back again to the phase-frequency detector 1 as a feedback signal b. A phase locked loop of this kind generates a transmission clock signal c of a frequency which is higher by a given factor than the frequency of the reference signal a, with the given factor corresponding to the dividing factor of the frequency divider 5.

A typical layout for recovering a clock signal in a receiving device is shown diagrammatically in FIG. 11. A phase detector 47 compares the phase of an incoming data signal t with that of a feedback signal u and once again transmits a phase-difference signal to a loop filter 48, which generates a control signal for a voltage-controlled oscillator 49. The latter's output signal u is then used for sampling and demultiplexing the data and as a feedback signal for the phase locked loop. A transceiver contains both the arrangement shown in FIG. 10 and the one shown in FIG. 11.

If, as is generally the case, the transmission clock signal c and the reception clock signal u are not synchronized, this may lead to an interaction between the voltage-controlled oscillators 3, 49 and thus, possibly, to a beat and to increased noise in the voltage-controlled oscillator 3 of the transmission section. Also, at high clock rates, the implementation of clock signal recovery shown in FIG. 11 leads to difficulties in suppressing noise, to a relatively high current consumption and to the component tolerances having to meet severe demands.

SUMMARY

The present invention relates to an arrangement for generating a transmission clock signal and a reception clock signal for a transceiver, and to a transceiver so equipped. The present invention further relates to methods preferably for use in the arrangement and methods of designing and verifying circuits which can be used for such an arrangement.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated, as they become better understood by reference to the following detailed description. The elements of the drawings are not necessarily to scale relative to each other. Like reference numerals designate corresponding similar parts.

FIG. 2 illustrates one embodiment of a phase interpolator according to the invention.

FIG. 3 illustrates a detailed block circuit diagram of a phase locked loop from FIG. 1.

DETAILED DESCRIPTION

Figure 1:
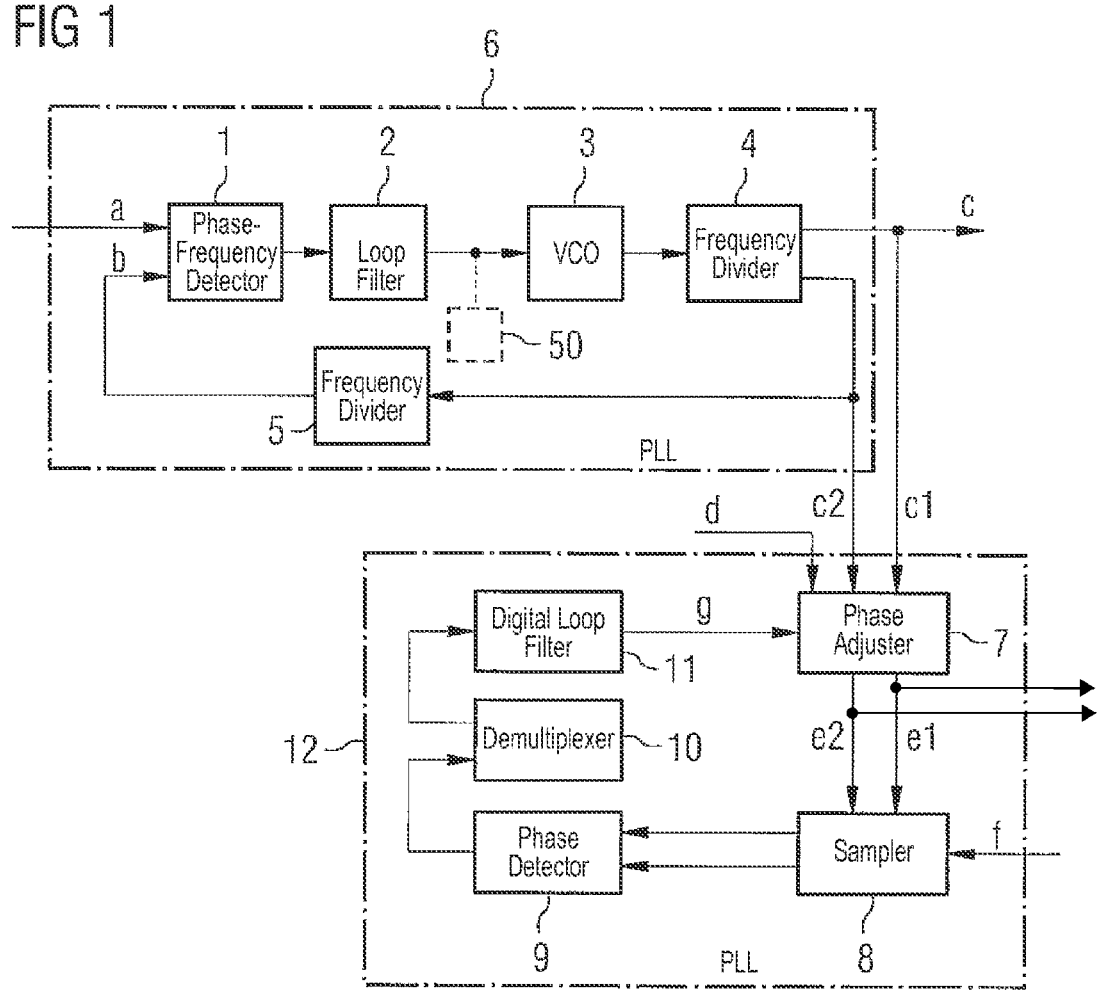
FIG. 1 is a block circuit diagram illustrating one embodiment according to the invention of an arrangement for generating a transmission clock signal and a reception clock signal.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides an arrangement for generating a transmission clock signal and a reception clock signal in which interaction between oscillators cannot occur and which is easy to implement.

In accordance with one embodiment of the invention, an arrangement for generating a transmission clock signal and a reception clock signal for a transceiver is proposed which comprises oscillator means for generating a clock signal and means for generating a transmission clock signal from the clock signal. The arrangement in accordance with the invention comprises, in addition, phase-adjusting means which are connected to the oscillator means and are so arranged that, by adjusting the phase of a signal derived from the clock signal to the phase of a received signal derived from a received signal received by the transceiver, they generate a reception clock signal.

In one embodiment, the oscillator means may, in particular, comprise a voltage-controlled oscillator in this case. What this means is that the arrangement according to the invention comprises only one oscillator and the reception clock signal is generated by adjustment of the phase of a signal generated essentially by the oscillator means.

The signal derived from the clock signal may, for example, be the transmission clock signal itself. The means for generating a transmission clock signal from the clock signal may comprise a clock-signal divider, to reduce the clock rate of the clock signal to a desired clock rate of the transmission clock signal.

The oscillator means are advantageously incorporated in a first phase locked loop. In this case the oscillator means may comprise, for setting a clock rate for the clock signal, a coarse-control input for a coarse-control signal and a fine-control input for a fine-control signal. A suitable oscillator having coarse-control facilities and fine-control facilities is known, for example, from German patent application 103 38 092.2, incorporated herein by reference. A particular advantage which oscillators of this kind have is that with them a low-noise phase locked loop is possible.

If such an oscillator is used, the following are preferably performed when the phase locked loop is initialized:

setting of the fine-control signal to a minimum value setting of the coarse-control signal to a minimum value step-by-step raising of the coarse-control signal until a feedback signal to the first phase locked loop, which feedback signal is derived from the output clock signal, is of a higher frequency than a reference signal to the first phase locked loop storage of a value obtained in this way of the coarse-control signal as a first reference value setting of the fine-control signal to a maximum value setting of the coarse-control signal to a maximum value step-by-step lowering of the coarse-control signal until the feedback signal to the first phase locked loop is of a lower frequency than the reference signal to the first phase locked loop storage of a value obtained in this way of the coarse-control signal as a second reference value setting of the coarse-control signal to an average value obtained from the first reference value and the second reference value.

By initialization in this way, the coarse-control signal is set to an optimum starting value. Initialization of this kind can in principle be used for any oscillator having coarse and fine control facilities.

The signal derived from the clock signal preferably comprises two clock signals which are 90° out of phase, and the phase-adjusting means preferably comprise two multipliers to each of which one of the two 90° out-of-phase clock signals can be fed. The multipliers are so arranged in this case that they multiply the clock signals respectively fed to them by respective settable factors. The phase-adjusting means also comprise in this case an adder for generating the reception clock signal simply by adding the multiplied clock signals. A very simple phase adjustment can be performed in this way.

The phase-adjusting means are preferably incorporated in a second phase locked loop for controlling the phase adjustment of the signal derived from the clock signal to the received signal, with the second phase locked loop comprising a phase detector which is so arranged that it compares the phase of the received signal with the phase of the reception clock signal and emits a phase-difference signal as a function of this comparison, and with the second phase locked loop comprising a loop filter which is so arranged that, as a function of the phase-difference signal, it generates a control signal for controlling the phase-adjusting means. This control signal may in particular be used to control the multipliers of the embodiment of phase-adjusting means described above.

The phase-difference signal in the second phase locked loop may in particular be, in this case, a signal having three states, with a first value of the signal indicating that the phase of the input signal matches the phase of the reception clock signal—within certain limits—or indicating that no correction of the phase of the reception clock signal is required or is to be undertaken, with the second value indicating that the phase of the input signal is lagging relative to the phase of the reception clock signal, and with the third value indicating that the phase of the input signal is leading relative to the phase of the reception clock signal. The first value may in particular indicate in this case that there is not a data transition in the input signal and hence no phase relationship can be determined and there is therefore no correction to be undertaken.

For this purpose, the phase detector in the second phase locked loop may have means for detecting a data transition in the input signal, which means are so arranged that they emit a data-transition indicating signal as a function of the presence of a data transition in the input signal, which data-transition indicating signal is correlated with, for example multiplied by, a phase-comparison signal generated by phase-comparison means to give the phase-difference signal to be fed to the loop filter.

The loop filter in the second phase locked loop may have inserted upstream of it a demultiplexer for demultiplexing the signal to be fed to the loop filter.

The loop filter in the second phase locked loop may itself comprise limiter means for limiting the gradient of the signal to be fed to the loop filter, an integrator and/or a decimator.

A phase locked loop of this kind for phase-adjusting means can in principle also be used for applications other than to an arrangement for generating a transmission clock signal and a reception clock signal.

To establish whether the first phase locked loop and/or the second phase locked loop are/is locked-on, the particular phase locked loop may comprise an assessing unit, with the assessing unit comprising at least one first counter and one second counter, the first counter being associated with a feedback signal to the particular phase locked loop and the second counter with a reference signal to the particular phase locked loop, the first counter and the second counter being so arranged that they count on at each cycle of the signal associated with them and that, when a preset count value is reached at the first or the second counter, the first and second counters stop and transmit an assessment signal to the assessing unit, the assessing unit being so arranged that, at the start of the process of establishing whether the particular phase locked loop is locked-on, it sets the first counter and the second counter to a fixed, common value, and on receipt of the assessment signal it establishes that the particular phase locked loop is locked-on if the difference between the value from the first counter and the value from the second counter is less than a preset first threshold value. It may in addition be so arranged that it establishes that the particular phase locked loop is not locked-on if the difference between the value at the first counter and the value at the second counter is more than a preset second threshold value, which latter may in particular be more than the preset first threshold value. By using two different threshold values, stable control can be achieved even when the phase locked loop is "only just" locked-on.

In one embodiment, the counters are preferably implemented in the form of hardware in this case, and the assessing unit in the form of software.

An assessing unit of this kind is suitable in principle for any phase locked loop.

The arrangement according to the invention for generating a transmission clock signal and a reception clock signal may in particular be built into a transceiver. A transceiver of this kind preferably has a layout in which the phase-adjusting means are arranged at a substantially central point. This makes short paths possible for the transmission of clock signals in the transceiver and thus makes it possible for the number of buffers required to be reduced. This is advantageous particularly when the transceiver is in the form of an integrated circuit employing so-called flip-chip packaging technology.

An input port or an output port of the transceiver may be connected to a supply voltage via a first series connection of two diodes which are connected in a first direction of polarity and via a second series connection of two diodes which are connected in a second direction of polarity opposite to the first direction, which second series connection is connected in parallel to the first series connection, the diodes being sized in such a way that they exhibit blocking behaviour during normal operation of the transceiver. Protection against electrostatic discharges can be obtained with diodes of this kind, the protection circuit composed of the diodes having a relatively low parasitic capacitance. If the input port and/or the output port has two part-ports to allow a differential signal to be fed in or picked off, each of the part-ports may be protected against electrostatic discharges by the first series connection and the second series connection.

In principle, protection of this kind against electrostatic discharges can also be used for other circuits.

To allow a circuit design for an arrangement according to the invention for generating a reception clock signal and a reception clock signal as described above to be verified, the contributions to jitter made by elements on a path from the oscillator means to an output port or input port can be added together, the contributions to jitter being calculated as standard deviations from a Gaussian distribution and being multiplied by the inverse cumulated distribution function of a preset bit error rate to give a total value for jitter, the circuit design being classed as verified if the total value for jitter does not exceed a preset value.

The loop filter in the second phase locked loop can be verified by linearizing the phase detector by convolving a high-frequency jitter distribution of a signal fed to the phase detector with a phase transfer function of the phase detector and by applying the gain given by the convolution about a zero point of the phase difference signal, checking the gain with the control loop open, a peak value with the control loop closed and a bandwidth of the control loop, checking, for a given sinusoidal jitter, whether the phase-adjustment error of the second phase locked loop is less than an increment of the resolution of the phase-adjusting means, and checking, for various jitters of the input signal, by means of a simulation of phase over time, whether the distribution of the phase-adjustment error of the phase locked loop corresponds to a preset distribution.

In FIG. 1 illustrates one embodiment of an arrangement according to the invention for generating a transmission clock signal and a reception clock signal. In it, a reference signal a, which may for example be generated by a quartz oscillator (not shown), and a feedback signal b are fed to a phase-frequency detector 1. The latter generates a phase-difference signal or error signal which is fed to a loop filter 2, which generates therefrom a control signal for a voltage-controlled oscillator 3. The clock signal emitted by the voltage-controlled oscillator 3 is fed to a frequency divider 4 which generates from it two clock signals c1 and c2 which are 90° out of phase, of which clock signals, clock signal c1 is used as a transmission clock signal c.

Clock signals c1 and c2 are also referred to as clock signals in quadrature. Clock signal c2 is fed to a further frequency divider 5 to allow the feedback signal b to be generated. Blocks 1 to 5 form in this case a first phase locked loop 6 by which the voltage-controlled oscillator 3 is controlled in such a way that the transmission clock signal c and the clock signals c1 and c2 have a clock rate or clock frequency which corresponds to the frequency of the reference signal a when multiplied by a given factor which corresponds to a dividing factor of the frequency divider 5.

A second phase locked loop 12 is used to generate a reception clock signal, or two phase-shifted input clock signals or reception clock signals e1, e2, from the clock signal c1, c2. For this purpose the clock signals c1, c2 are fed to phase-adjusting means 7. In addition, a signal d, by which a fixed offset is set, may be fed in. The offset may be used to compensate for an offset caused by so-called "bathtub" measurements for verifying the phase locked loop.

Controlled by a control signal g, the phase-adjusting means 7 generate from the clock signals c1, c2 reception clock signals e1, e2 which are fed to a sampling means 8. In the sampling means 8, a received signal f is sampled using the reception clock signals e1, e2. Also, the received signal f, or a signal derived therefrom, and one of the reception clock signals e1, e2 are passed on to a phase detector 9 which determines a phase difference between the reception clock signal fed to it and the received signal f. The signal generated by the phase detector 9 is fed to a demultiplexer 10 for reducing a clock rate and then to a second, digital loop filter 11, which emits the control signal g. When the second phase locked loop 12 is in a locked-in state, the phase angle of the reception clock signals e1 and e2 matches the phase angle of the received signal f, with the clock rate of the reception clock signals e1, e2 corresponding for example to half the clock rate of the received signal f to enable the received signal then to be sampled with a stagger for the purpose of demultiplexing.

In FIG. 2 illustrates a phase interpolator such as can be used in the phase-adjusting means 7 to generate the reception clock signals e1 and e2. The clock signals c1 and c2 are fed to two multipliers 13 in this case. The multipliers 13 multiply clock signals c1 and c2 respectively fed to them by a factor which can be set separately for each multiplier 13. This factor is determined for each of the multipliers from the control signal g by an assessing unit 52. The outputs of the multipliers 13 are connected to an adder 14 which adds the multiplied clock signals c1 and c2 together to form the reception clock signal e1. For the reception clock signal e2, a further phase interpolator 31 is provided in the phase-adjusting means 7.

The multiplication of the clock signals c1 and c2 may be performed with discrete factors in this case in such way that the resolution of the phase interpolator is ⅟₃₂nd of a full cycle 2Π. A resolution of this kind is adequate for good performance by the phase-adjusting means and is relatively simple to implement; a higher resolution would require additional circuits.

In FIG. 3, the second phase locked loop 12 from FIG. 1 is illustrated in detail. The phase detector is illustrated in greater detail in this case in the dotted and dashed block identified as 9. In this case the received signal f and for example the reception clock signal e1 are fed to a phase detector unit or phase comparator means 53, which determines a phase-comparison signal and feeds it to an analogue-to-digital converter 15. At a clock rate which corresponds to the reception band rate h, the 1-bit analogue-to-digital converter 15 converts the phase-comparison signal into a signal having two states −1 and 1, where a 1 and a −1 mean that the phase of the reception clock signal e1 is respectively leading and lagging the phase of the received signal f. What would also be conceivable in principle would be an analogue-to-digital converter 15 of higher resolution, such as a 1.5-bit converter for example, which would be able to emit the value 0 as an additional state of the phase-comparison signal to indicate that the phases of the reception clock signal e1 and the received signal f were substantially the same.

The received signal f is also fed to an analogue-to-digital converting unit 16 which emits a 1 if there is a data transition in the received signal f and a 0 if there is not. Both the analogue-to-digital converter 15 and the analogue-to-digital converting unit 16 cause a signal delay and have the transfer function $z^{-1}$. The signals generated in this way are multiplied by a multiplier 17. The signal which arises in this way can then assume the three possible states 1, −1 and 0, in which case 0 then means that no correction of the phase of the reception clock signal is being performed because, for lack of a data transition in the input signal f, no "usable" phase difference can be determined. This signal is then fed to a demultiplexer 10 which demultiplexes it in accordance with the reception band rate h. The demultiplexer has a transfer function of $$\frac{z^n - 1}{z^n - z^{n-1}},$$

where n represents the demultiplexing ratio and is for example 16. The signal which has been demultiplexed in this way is fed to a limiter 18 which limits the gradient of the signal. Connected in series with the latter is an integrator having a transfer function of $$\frac{1}{z-1}$$

which is operated at a clock rate i corresponding to the demultiplexing ratio n. Following the integrator is a decimator having a decimation ratio of $$\frac{1}{m}$$

where m=32. The limiter 18, integrator 19 and decimator 20 form the second, digital loop filter 11, whose output signal g controls the phase-adjusting means 7. For the sake of simplicity, only the path for the reception clock signal e1 is shown in the present case.

The voltage-controlled oscillator 3 from FIG. 1 may have coarse control facilities and fine control facilities and if this is the case the first loop filter 2 emits two signals, a coarse-control signal and a fine-control signal, to the voltage-controlled oscillator 3. This is particularly advantageous for making a low-noise first phase locked loop 6 possible. A coarse-control signal for the coarse control of the voltage-controlled oscillator 3 is preferably so selected in this case that it can, as far as possible, remain unchanged during the following control process. For this purpose, a control unit 50 may carry out the following method:

Setting of the fine-control facility to a minimum frequency, in which case the fine-control signal may for example be generated by a digital-to-analogue converter or a charge pump.

Raising of the coarse-control signal, starting from a setting for the lowest frequency, until the frequency of the feedback signal b is above the frequency of the reference signal a. The relevant value of the coarse-control signal is stored as a first reference value.

Setting of the fine-control facility to its maximum frequency.

Reduction of the coarse-control signal from a setting for the maximum frequency until the feedback signal b is of a lower frequency than the reference signal a. The relevant value of the coarse-control signal is stored as a second reference value.

Using as an optimum signal value for the coarse-control signal a value midway between the first and second reference values.

It is also important to be able to establish whether the first phase locked loop 6 or the second phase locked loop 12, as the case may be, is locked-on. For this purpose, the respective phase detectors 1 and 9 may comprise, in addition, assessing units. The operation of an assessing means of this kind is described below by taking the first phase locked loop 6 as an example, but the description is equally applicable to the second phase locked loop 12.

To be able to establish whether the first phase locked loop 6 is locked-on, two counters are provided in the phase detector 1, a first one of the counters being associated with the reference signal a and a second one of the counters being associated with the feedback signal b. The two counters are set to a fixed value and at each clock cycle of the signals associated with them they count down by one. As soon as either of the counters reaches a count value of 0, the counter in question emits an interrupt, which causes both counters to be stopped. The assessing unit incorporated in the phase detector compares the value in the counter which has not reached 0 yet with a preset threshold value. If the count in the counter is less than the threshold value, the phase locked loop is locked-on to within the requisite accuracy.

To be able to establish whether, after a lock-on, the locked-on state has been lost again, the method can be applied again, in which case the phase locked loop is then preferably assumed to be no longer locked-on when the count value in the counter whose count is not 0 exceeds a second threshold value, with the second threshold value being higher than the first threshold value. In this way, by introducing hysteresis into the behavior of the assessing unit, it is possible to avoid a constant hopping to and fro between a locked-on state and a not-locked-on state being indicated.

It is of course also possible for a count value of other than 0 to be used to trigger the interrupt and when this is the case the difference between the count values in the two counters has to be formed.

Through fixing the starting value for the two counters, a measurement period and an accuracy of measurement are set.

Figure 4:
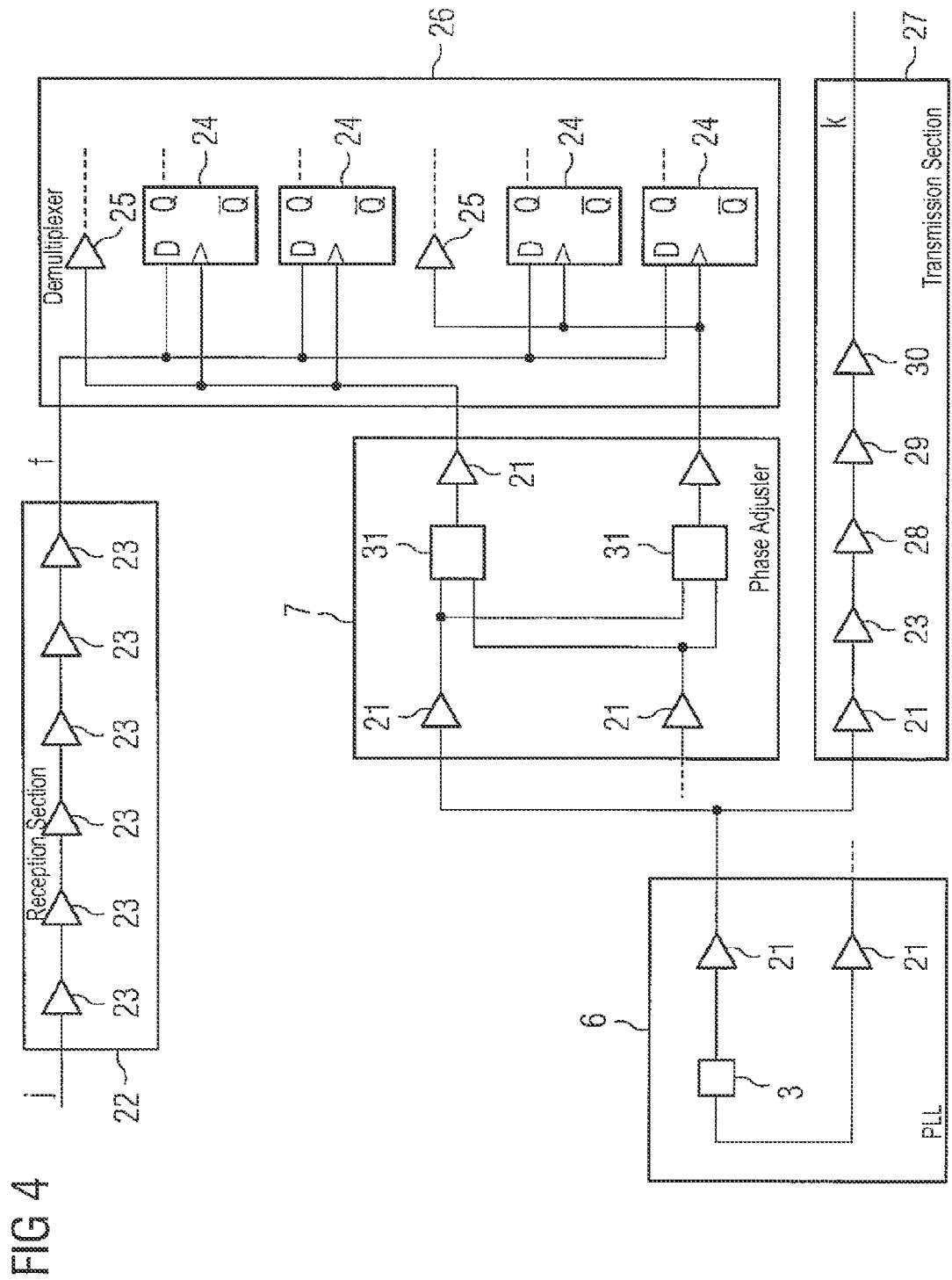
FIG. 4 illustrates, in diagrammatic form, an embodiment of transceiver which comprises the arrangement according to the invention for generating a transmission clock signal and a reception clock signal.

In FIG. 4 is shown a transceiver which comprises the arrangement described for generating a transmission clock signal and a reception clock signal. For reasons of simplicity, not all the lines and components of the arrangement described above have been shown.

Provided in the centre of the transceiver is the phase-adjusting means 7. This comprises, as described, two phase interpolators 13. There are also buffers 21 provided for communicating with other parts of the circuit. What is further shown, schematically, is the first phase locked loop 6 which, in the present embodiment, likewise has buffers 21 for the output of the corresponding clock signals c1 and c2. In the case of the transceiver shown, a received input signal j is amplified by a reception section 22, which contains a string of amplifiers 23, to give the received signal f which has already been explained. This latter is sampled in a demultiplexing unit 26 by means of the reception clock signals generated by the phase-adjusting means. The demultiplexing unit 26 contains in this case demultiplexers, which may take the form of latches 24, and clock signal dividers 25. In fact, the demultiplexing unit 26 will generally comprise a complete demultiplexing tree for the step-by-step reduction of the clock frequency, which is indicated by the dashed lines.

The transmission clock signal generated by the first phase locked loop 6 is used in a transmission section 27 to generate a transmitted signal k. The transmission section 27 comprises in this case a buffer 21, an amplifier 23, a multiplexer 28 and two driver stages 29 and 30.

As far as the physical arrangement is concerned, the layout in FIG. 4 corresponds to an actual preferred circuit layout, particularly where the transceiver is implemented in the form of an integrated circuit, because paths for the clock signals can be kept short in this case and hence only a few buffer stages 21 are needed.

An input port for the feed-in of the input signal j and an output port for picking off the output signal k of the circuit shown in FIG. 4 should be protected against electrostatic discharges (ESD) in this case to prevent the circuit from possibly being destroyed or adversely affected by electrostatic discharges.

Figure 5:
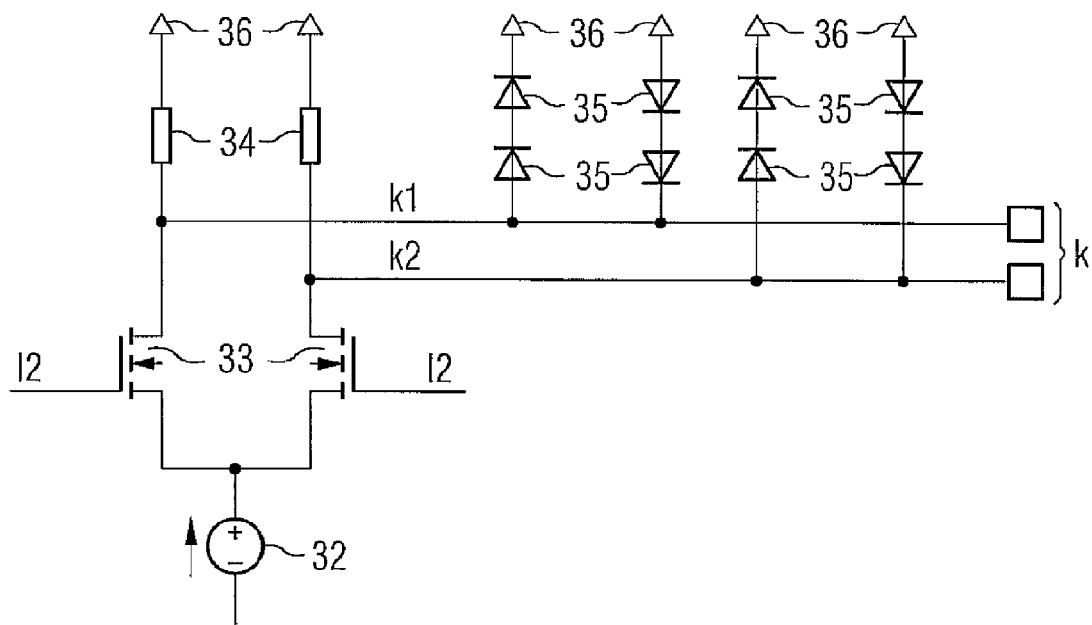
FIG. 5 illustrates an output according to the invention of the transceiver of FIG. 4.

FIG. 5 illustrates one embodiment of anti-ESD protective circuit of this kind for the output port of the circuit of FIG. 4. The output signal k is a differential signal in this case having part-signals k1 and k2. It is generated in the transmitting unit 27 by a final buffer, comprising a current source 32, a differential pair of transistors 33, and load resistors 34, from a differential signal 11, 12. The buffer takes the form in this case of a conventional difference amplifier using emitter-coupled logic (i.e., current mode logic), as can be seen from FIG. 5. Reference numeral 36 denotes in this case a supply voltage, such as, for example, the positive supply voltage VDD. The part-signals k1 and k2 are picked off in this case between the transistors 33 and the load resistors 34. For anti-ESD protection, there are provided for each of the two part-signal lines for signals k1 and k2 two parallel circuit paths each having two diodes 35 connected in series, with the diodes on one circuit path being connected in one direction of polarity and those on whichever is the other circuit path being connected in the other direction of polarity. The diodes 35 are sized in this case in such a way that they are in a blocking state when the circuit is operating normally, that is to say when there is the normal relatively low modulation of the part signals k1 and k2. If however an electrostatic discharge acts on the output port, the series connection of diodes 35 of the appropriate polarity becomes conductive and diverts the discharge onto the supply voltage 36. An anti-ESD protective circuit of this kind has a lower impedance compared to conventional circuits and in this way parasitic impedance at the output is minimized, which optimizes dissipated power.

Figure 6:
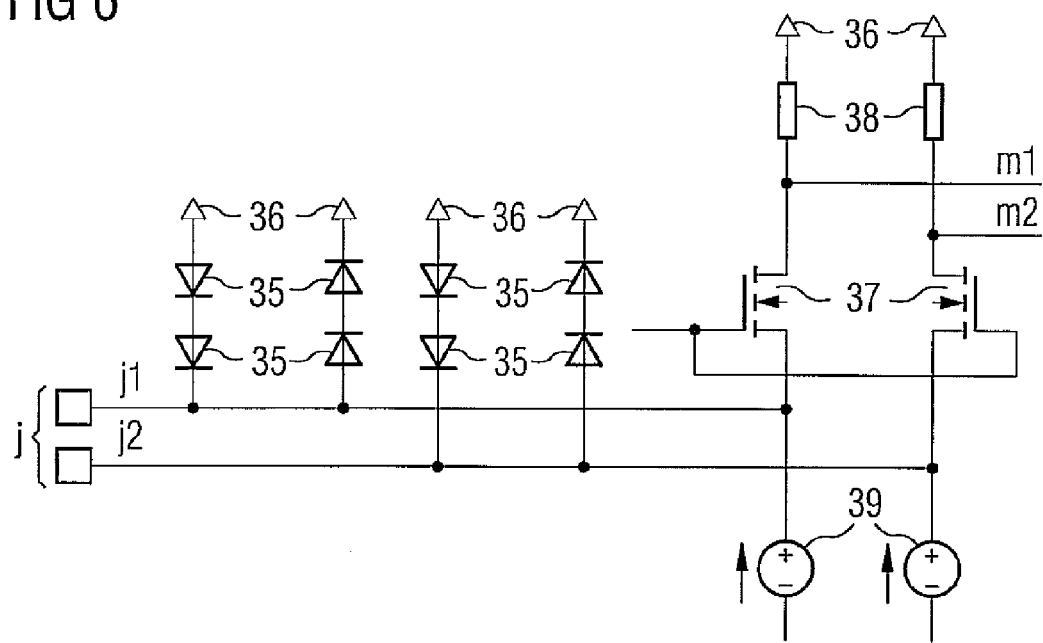
FIG. 6 illustrates an input according to the invention of the transceiver of FIG. 4.

FIG. 6 illustrates a similar circuit for the anti-ESD protection of an input port for the input signal j, which is once again a differential signal having part signals j1 and j2. Use is again made of series connections of two diodes 35 connected one behind the other, to allow a voltage spike which may possibly occur to be diverted onto the supply voltage 36. The connection and sizing of the diodes are similar in this case to those illustrated in FIG. 5.

The input signals j1, j2 are first processed by a first buffer stage which is constructed from two current sources 39, a differential pair of transistors 37, and load resistors 38, which components are connected as shown in FIG. 6. In contrast to the buffer shown in FIG. 5, the transistors 37 forming the differential pair are at a common gate voltage 51 and the part signals j1, j2 are fed in between the respective current sources and the respective transistors. A high series resistance can be avoided by means of this circuit arrangement. Together with the low parasitic capacitance of the anti-ESD protective circuit, this gives a low band limit and hence a low data-dependent jitter.

In what follows, possible ways of verifying and designing a circuit according to the invention of this kind will also be looked at.

It is first of all important to ensure that a circuit such as the circuit in FIG. 4 meets requirements which are set for jitter. The critical paths for jitter run in this case from the input port to the voltage-controlled oscillator 3 and from the voltage-controlled oscillator 3 to the output port. The jitter contributed by each block or each element on the particular critical path is calculated, by a simulation for example. When this is done, what are taken into account are contributions to jitter which originate from phase noise, component non-conformances, jitter due to the limited resolution of the phase interpolator, power-supply noise, common-mode noise, layout non-conformances, phase-adjustment errors (between adjacent clock-signal paths for example) and what are termed set-up and hold uncertainties in the sampling means. Except for the phase noise, all these contributions are of limited deterministic jitter. All these deterministic contributions are added together linearly as root mean square standard deviations from a Gaussian distribution and are multiplied by the inverse cumulated distribution function of a required bit error rate, such as, for example, by 2×7 for a bit error rate of $1 \times 10^{-12}$. Random jitter too can be allowed for but this is preferably added not linearly but by the root mean square process. Critical elements in this case are in particular the voltage-controlled oscillator itself, various buffers in FIG. 4, the phase interpolators 31 and the sampling means. As well as this, the driver stages 29, 30 of the transmitting unit also contribute to the jitter. The circuit design is accepted if the total jitter on the given critical path is within a predefined range.

Another critical block is the second phase locked loop 12 which is illustrated in FIG. 3. Because both the phase detector block 8, 9 and the loop filter 11 are non-linear in operation, a standard analytical procedure cannot be applied here. The method used to verify this second phase locked loop 12 is as follows:

For a maximum permitted phase-difference signal at the input to the limiter 18 which is calculated from the forward loop gain, a check is made on whether this maximum permitted phase-difference signal corresponds to a required limit which is given by jitter and frequency-offset requirements.

The non-linear phase detector is linearized by convolving the high-frequency jitter probability distribution function of the incoming signal f with the phase transfer function of the phase detector, the linear gain given by the convolution about the point of zero phase-error being used for the linearization.

The z-transformed transfer function of all the blocks in the loop filter 11 is transformed into the s domain (signal domain).

The gain with the control loop open, a peak value with the control loop closed, and the 3 dB bandwidth are checked.

A phase-adjustment error of the phase locked loop for a given sinusoidal jitter is then checked to see whether it is smaller than the one-bit resolution of the phase interpolator 7, to ensure the stability of the phase locked loop 12.

By means of a simulation of phase over time, the phase-error probability distribution function for various input phase jitters which correspond to defined system requirements is measured. In this way the effective bandwidth, a discrete phase adjustment error and stability requirements can be checked.

Figure 7:
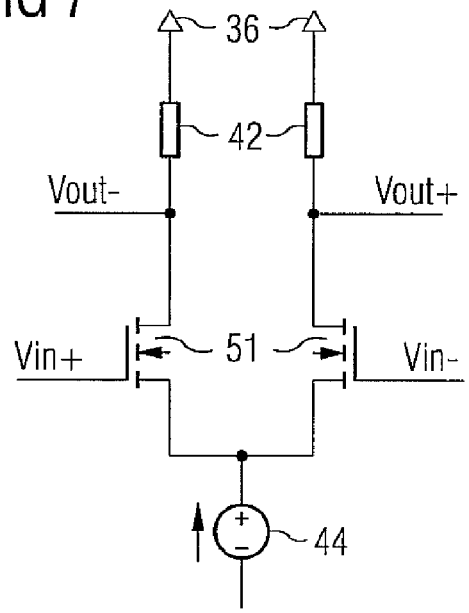
FIG. 7 illustrates a buffer stage of the transceiver of FIG. 4.

Finally, it is also important for the buffer stages in FIG. 4 to be sized in the optimum way. The construction of a buffer stage of this kind, such as is used for clock signal distribution and in the receiver section, is illustrated in FIG. 7. FIG. 7 illustrates a buffer stage using emitter-coupled logic which has a current source 44, a differential pair of NMOS transistors 51, and load resistors 42. Reference numeral 36 once again denotes the positive supply voltage VDD. The buffer stage thus constitutes a difference amplifier. A differential input signal having part signals Vin+ and Vin− is fed to the buffer stage and a differential output signal having part signals Vout+, Vout− is picked off from it.

This buffer stage must be optimized in such a way that each buffer stage has a gain greater than 1 for clock signals and a gain which is as nearly optimum as possible for received signals, in such a way that it has jitter due to band limiting which is as low as possible, and in such a way that it is of minimum size and thus has a minimum current consumption. Also, as few buffers as possible of this kind should have to be used, which, as already explained, can sometimes be achieved by a circuit layout as illustrated in FIG. 4. For this purpose the buffer stage is simulated, in which case the channel width of the NMOS transistors 51 and the scaling factor of the buffer stage as a whole are varied, with the size of the buffer stage being defined by scaling factor in relation to a test buffer which is driven by the buffer stage.

The range of modulation of the signals Vin, Vout is assumed to be equal to the threshold of the NMOS transistor 51. The sizing of the NMOS transistors 51 is then determined for this range of modulation in such a way that they are able to switch a given current from the current source 44. The size of the load resistors 42 is obtained as a ratio of the modulation to the current.

Figure 8:
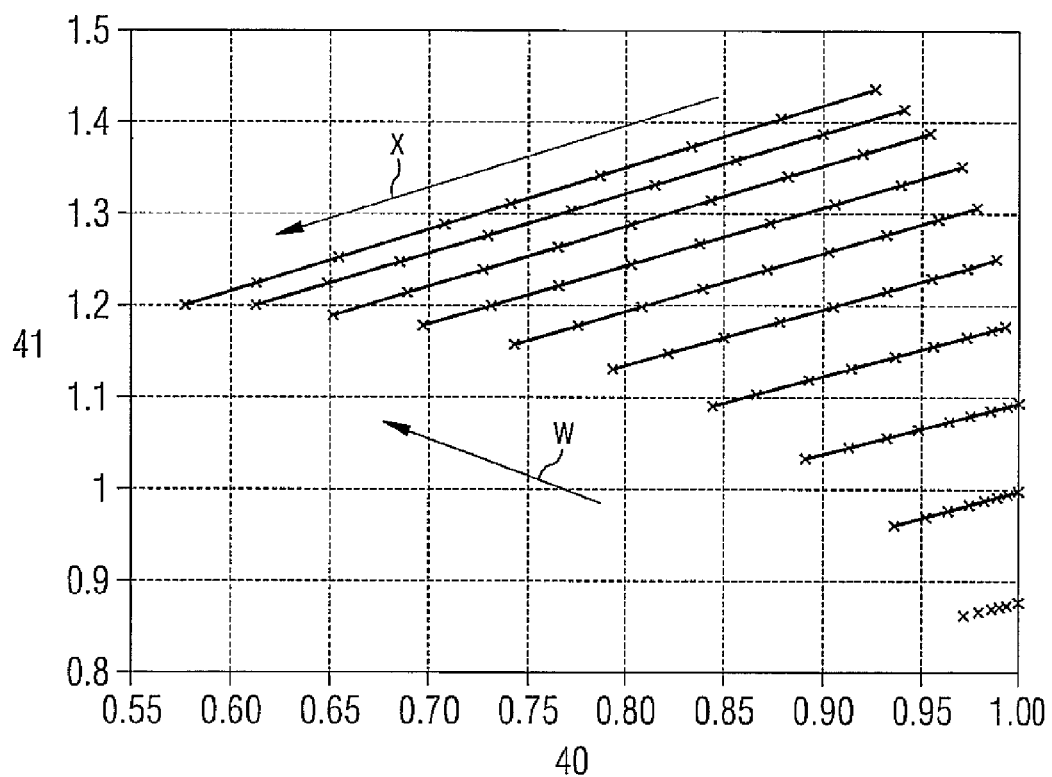
FIG. 8 is a graph which illustrates the process of designing the buffer stage of FIG. 7.
Figure 9:
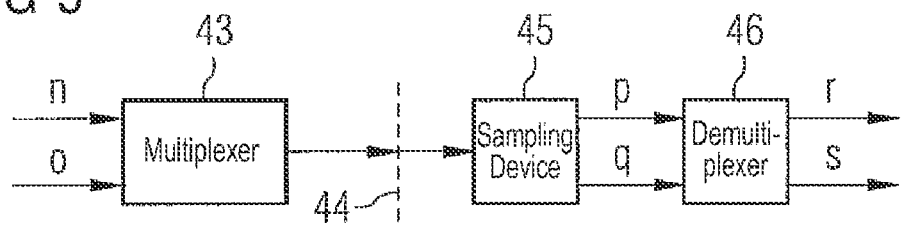
FIG. 9 is a diagrammatic representation of a conventional transmission link.
Figure 10:
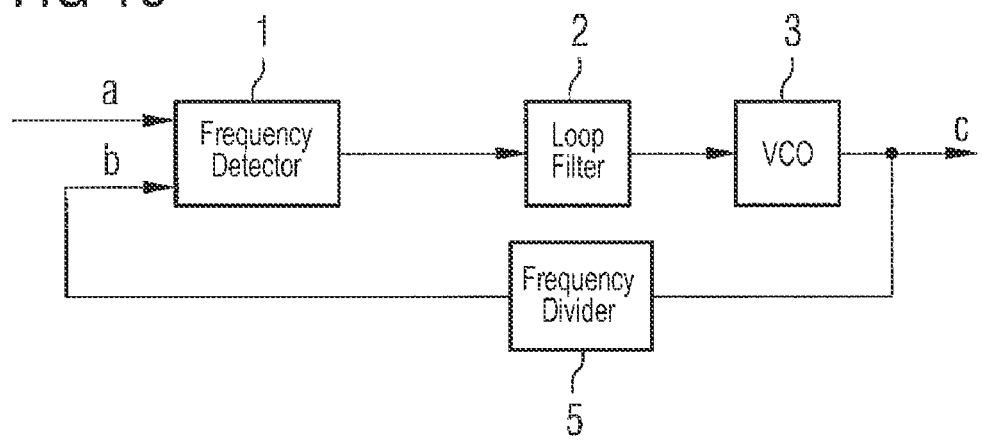
FIG. 10 is a diagrammatic representation of a conventional arrangement for generating a transmission clock signal.
Figure 11:
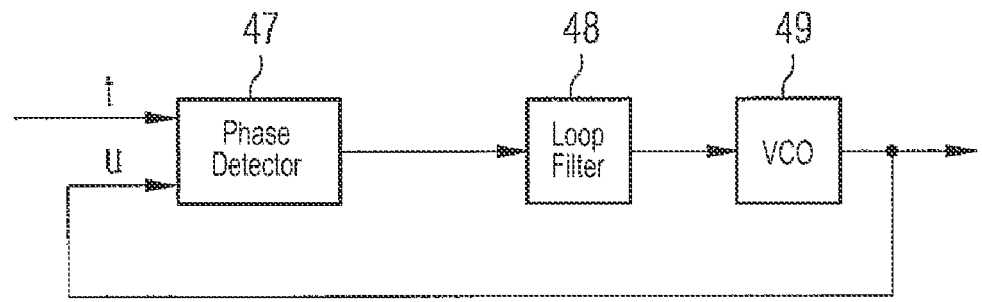
FIG. 11 illustrates a conventional arrangement for generating a reception clock signal.

The buffer is simulated, as illustrated in FIG. 8, for various channel widths and various scaling factors, with the results being plotted in FIG. 8 as gain 41 against a band limitation 40. An arrow w indicates increasing channel width, such as from 5 μm to 18 μm for example, in this case, and an arrow x indicates an increasing scaling factor, such as, for example, from 0.8 to 2.4 in increments of 0.2. For buffers in a clock signal line, a maximum band limitation of 0.95 is assumed, which gives a maximum scaling factor of 2 if a gain of 1 is to be obtained. For buffers on a reception path, a maximum band limitation of 0.9 is permitted, which allows rather more jitter. For a scaling factor of 1 a maximum gain of 1.4 is then obtained.

The circuits shown are of course to be looked upon merely as illustrative embodiments. In particular, various elements such as, for example, the anti-ESD protective circuits or the method of establishing the lock-on of a phase locked loop may also be used independently of the transceiver shown.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An arrangement for generating a transmission clock signal and a reception clock signal for a transceiver, comprising:

an oscillator configured to generate a clock signal, wherein the oscillator comprises a coarse-control input for a coarse-control signal and a fine-control input for a fine-control signal, for setting the frequency of the clock signal;

a clock generator configured to generate the transmission clock signal from the clock signal;

a phase-adjustor connected to the oscillator, configured to generate the reception clock signal by adjusting the phase of a signal derived from the clock signal to the phase of a received signal received signal received by the transceiver or a signal derived from the received signal; and a controller configured to initialize the oscillator by performing the following:

setting of the fine-control signal to a minimum value;

setting of the coarse-control signal to a minimum value;

raising of the coarse-control signal step-by step until a feedback signal, derived from the clock signal, is of a higher frequency than a reference signal;

storing a value obtained in the raising of the coarse-control signal as a first reference value;

setting of the fine-control signal to a maximum value;

setting of the coarse-control signal to a maximum value;

lowering of the coarse-control signal step-by-step until the feedback signal is of a lower frequency than the reference signal;

storing a value obtained in the lowering of the coarse-control signal as a second reference value; and setting of the coarse-control signal to an average value obtained from the first reference value and the second reference value.

2. A method of initializing oscillator means, the oscillator means being incorporated in a first phase locked loop and the oscillator means comprising a coarse-control input for a coarse-control signal and a fine-control input for a fine-control signal, for setting the frequency of a clock signal, wherein the method comprises:

setting of the fine-control signal to a minimum value;

setting of the coarse-control signal to a minimum value;

raising of the coarse-control signal step-by-step until a feedback signal to the first phase locked loop is of a higher frequency than a reference signal to the first phase locked loop;

storing a value obtained in the raising of the coarse-control signal as a first reference value;

setting of the fine-control signal to a maximum value;

setting of the coarse-control signal to a maximum value;

lowering of the coarse-control signal step-by-step until the feedback signal to the first phase locked loop is of a lower frequency than the reference signal to the first phase locked loop;

storing a value obtained in the lowering of the coarse-control signal as a second reference value; and setting of the coarse-control signal to an average value obtained from the first reference value and the second reference value.

\* \* \* \* \*